(12) United States Patent
Ballou (10) Patent No.: US 8,658,882 B1
(45) Date of Patent: Feb. 25, 2014

(54) CONTACTLESS POWER GENERATION

(75) Inventor: Philip J. Ballou, Alameda, CA (US)

(73) Assignee: The Boeing Company, Chicago, IL (US)

( * ) Notice: Subject to any disclaimer, the term of this patent is extended or adjusted under 35 U.S.C. 154(b) by 1192 days.

(21) Appl. No.: 12/512,592

(22) Filed: Jul. 30, 2009

(51) Int. Cl.
*H01L 31/042* (2006.01)
*H01L 33/00* (2010.01)
*F21S 8/00* (2006.01)

(52) U.S. Cl.
USPC .......... 136/244; 136/245; 136/246; 136/248; 136/251; 257/89; 257/98; 257/723; 315/294; 362/268; 362/297

(58) Field of Classification Search
USPC .............................................. 136/244; 429/7
See application file for complete search history.

(56) References Cited

U.S. PATENT DOCUMENTS

| 4,730,115 | A * | 3/1988 | Abe ............................... 250/551 |
| 5,522,943 | A * | 6/1996 | Spencer et al. ................ 136/245 |
| 6,469,638 | B1 * | 10/2002 | Johnson ................... 340/870.16 |
| 2006/0185727 | A1 * | 8/2006 | Matan ............................. 136/293 |
| 2007/0001582 | A1 * | 1/2007 | Shin et al. ..................... 313/498 |
| 2011/0108103 | A1 * | 5/2011 | Tuma ............................. 136/256 |

FOREIGN PATENT DOCUMENTS

| WO | WO 2008002073 A1 * | 1/2008 |
| WO | WO 2009059738 A2 * | 5/2009 |

OTHER PUBLICATIONS

Giehl, WO 2002002829 A2, English Machine & Human Translation, Jan. 2005, World Intellect, pp. 1-27.*
Sugiyama et al., JP 2006106917 A, English Machine Translation, 04-20065, Japan, pp. 1-29.*
Merriam-Webster Learners Dictionary, 'drive shaft' [online], [retrieved Oct. 3, 2012]. Retrieved from the Internet:<URL: http://www.learnersdictionary.com/search/driveshaft>, p. 1.*
Kohraku et al., A fundamental experiment for discrete-wavelength LED solar simulator, vol. 90 (2006), pp. 3364-3370.*

(Continued)

*Primary Examiner* — Jeffrey T Barton
*Assistant Examiner* — Tae-Sik Kang
(74) *Attorney, Agent, or Firm* — Hope Baldauff, LLC (57) ABSTRACT

Concepts and technologies described herein provide for providing power to an electronic device mounted to a moving apparatus. According to various aspects, a flexible solar panel is detachably mounted to the moving apparatus. A light emitting diode (LED) array is mounted on a flexible circuit board and is configured to emit light at a color temperature range that matches the effective response of the solar panel. The LED array is shaped according to the surface of the moving apparatus and is positioned a uniform gap width apart from the solar panel. When the moving apparatus is activated, light from the fixed LED array is received by the moving solar panel and converted into electricity for powering the electronic device that is electrically connected to the solar panel. Data from the electronic device may be wirelessly transmitted from the moving apparatus to a fixed receiver for storage or use.

20 Claims, 4 Drawing Sheets

(56) References Cited

OTHER PUBLICATIONS

Lazear, John. 'Nanometer to Kelvin Conversion'. In Cinematography Mailing List [Online]. Dec. 26, 2003 [retrieved on Nov. 28, 2012]. Retrieved from the Internet:<URL: http://www.cinematography.net/edited-pages/NanometerToKelvinConversion.htm>, pp. 1-5.*

Other website product(s) at: http://www.powerfilmsolar.com/products/ printed on Jul. 30, 2009; 1 page.

Other website product(s) at: http://www.guth.com/guth/CatalogCategories/LED.html, printed on Jul. 30, 2009; 1 page.

Other website product(s) at: http://www.bernardauroux.com/lp/products/products.html, printed on Jul. 30, 2009, 1 page.

Other website product(s) at: http://www.philipslumileds.com/products/luxeon/luxeonl, printed on Jul. 30, 2009, 3 pages.

* cited by examiner

CONTACTLESS POWER GENERATION

BACKGROUND

In industrial and other environments, there are sometimes situations in which an electronic device is attached to a moving part. More specifically, situations arise in which it is desirable to attach an electronic sensor to a moving device in order to measure characteristics or operational parameters associated with the device in motion. Due to the motion of the device to which the sensor is being attached, it can be challenging to provide the sensor with the power required to sustain operations of the sensor over the desired period of time. The sensor may not be able to receive power directly from a stationary power source due to the required power cord, particularly when the device in motion is rotating.

One solution to providing power to a device that is rotating or otherwise in motion includes utilizing a battery within the sensor to provide the power. However, batteries have a limited operational life before recharging is required. When the moving part is in motion for extremely long, uninterrupted time periods, it is not possible to recharge or change the battery within the sensor. Another solution includes utilizing slip rings to transfer power between a stationary part and a rotating part via brushes and electrical contacts. Similarly, inductive coupling solutions can be utilized to transfer power from a stationary power source to a rotating component. However, these solutions, slip rings and inductive coupling, are often prohibitively expensive, particularly in light of the custom fittings that are often required for any particular application and the close tolerances required between components of the respective power system. Installation of slip rings and inductive coupling solutions also requires significant downtime due to the custom fittings, close tolerances, and periodic maintenance requirements. There are currently no relatively inexpensive solutions that can be installed and removed quickly and easily.

It is with respect to these considerations and others that the disclosure made herein is presented.

SUMMARY

It should be appreciated that this Summary is provided to introduce a selection of concepts in a simplified form that are further described below in the Detailed Description. This Summary is not intended to be used to limit the scope of the claimed subject matter.

Concepts and technologies described herein provide for contactless power generation that enables power to be transferred from a stationary power source to an electronic device mounted to a moveable apparatus. According to one aspect, a solar panel may be mounted to a movable apparatus. The solar panel is electrically connected to a device that will utilize the power provided by the solar panel. A stationary light-emitting diode (LED) array having a number of LEDs provides light to the solar panel. The LED array is positioned so that the LEDs are spaced evenly from the solar cells within the mounted solar panel.

According to another aspect, a method for providing electricity to a power receiving device on a movable apparatus includes mounting a solar panel to a movable apparatus. The solar panel is electrically connected to the power receiving device and an LED array is positioned a fixed distance from the solar panel. The movable apparatus is put into motion and light is provided from the LED array to the moving solar panel at an optimized color temperature. The solar panel converts the light into electricity and powers the power receiving device.

According to yet another aspect of the disclosure, a contactless power generation system includes a flexible solar panel detachably mounted to a rotatable shaft and connected to a device that will receive and utilize the power generated by the solar panel. An LED array includes a flexible circuit board that allows the array to be shaped according to the outer surface of the rotatable shaft to which the flexible solar panel is mounted in order to provide uniform light from the LEDs evenly spaced a gap width apart from the solar cells of the solar panel. The solar panel on the movable apparatus utilizes the light provided by the LED array to create electricity for the power receiving device.

The features, functions, and advantages that have been discussed can be achieved independently in various embodiments of the present disclosure or may be combined in yet other embodiments, further details of which can be seen with reference to the following description and drawings.

DETAILED DESCRIPTION

The following detailed description is directed to a system and method for providing power from a stationary power source to a device that is rotating or otherwise in motion. As discussed above, traditional solutions for providing power to rotating electronic devices typically includes the use of costly slip rings or induction coupling. In addition to being costly, these solutions often require custom installations and periodic maintenance that require extensive downtime for the system to which the devices are being attached.

Utilizing the concepts and technologies described herein, LED arrays mounted on a flexible circuit board may be utilized as a stationary light source for flexible solar panels that may be detachably attached to a rotating shaft or other movable apparatus. The solar panels receive the light from the stationary LED arrays while the movable apparatus is in motion, and in turn, transforms the light into electricity that is provided to one or more sensors or other electronic devices mounted to the movable apparatus. Data from the electronic devices may be transferred wirelessly from a transmitter mounted on the movable apparatus to a wireless receiver that is positioned within range of the wireless transmitter.

The systems and methods described herein provide a low-cost, flexible solution to providing power to a moving electronic device. The flexible solar panels may be wrapped around any surface of a movable apparatus and a corresponding flexible LED array may be shaped and positioned according to the surface and movement of the movable apparatus to which the flexible solar panel is attached in order to provide a uniform, efficient light field for conversion to electrical power by the solar panel. Moreover, as will be described in greater detail below, the use of LEDs provides an advantage over other potential light sources, such as incandescent and fluorescent lights, for powering the solar panels in environments where sunlight is not available.

In the following detailed description, references are made to the accompanying drawings that form a part hereof, and which are shown by way of illustration, specific embodiments, or examples. The following disclosure and the accompanying figures describe the various embodiments in the context of a rotating shaft. Specifically, the following disclosure will be described utilizing an illustrative example in which a strain gauge is to be mounted to a rotating propeller shaft within a ship in an effort to measure the torque applied to the shaft. This example clearly demonstrates a situation in which it would be desirable to have a power generation system that is simple to install, saving critical downtime for the ship, and is a relatively inexpensive method for providing power to a rotating strain gauge using ship power without the need for customized fittings and installations.

However, it should be understood that the embodiments described herein may also be applied to any other rotating shafts, such as other vehicle drive shafts and drill shafts such as those used with an oil drilling rig. It should also be clear that the embodiments described below may be utilized with any movable apparatus and are not limited to a rotating embodiment. For example, the embodiments described below may equally apply to an oscillating device that moves linearly back and forth, as will be described in greater detail below.

Moreover, the term "contactless" is used throughout this disclosure to describe a power generation system and method in which power is transferred from a fixed power source (i.e., the ship power in the example described below) to a power receiving device (i.e., the strain gauge mounted to the propeller shaft) in a manner in which direct contact between stationary and moving power generation components is not required. In the embodiments described below, there is no direct contact between the LED array and the solar panel during the generation of electricity that is used to power the power receiving device, or strain gauge in the example provided.

Figure 1:
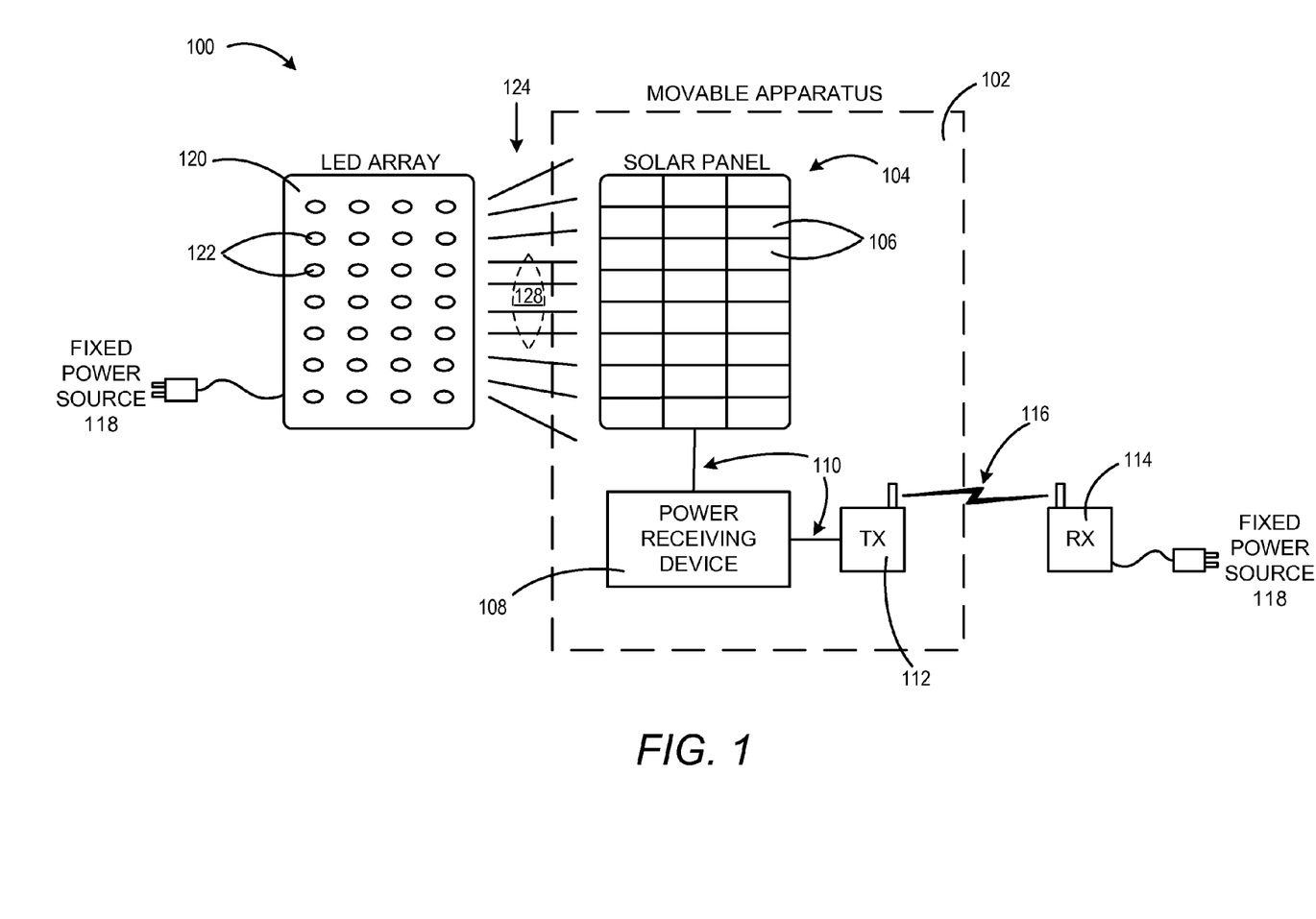
FIG. 1 is a block diagram of a contactless power generation system according to various embodiments described herein.

Referring now to the drawings, in which like numerals represent like elements through the several figures, contactless power generation according to the various embodiments will be described. FIG. 1 shows a block diagram illustrating a contactless power generation system 100 according to various embodiments described herein. The contactless power generation system 100 may include a movable apparatus 102 to which a solar panel 104, a power receiving device 108, and a wireless transmitter 112 are attached. As mentioned above, the movable apparatus 102 may include a rotating shaft, an oscillating device, or any other apparatus that would prevent or restrict direct electrical contact while in motion.

The solar panel 104 includes any number of solar cells 106 that are configured to transform light into electricity in a manner conventionally known in the art. The solar panel 104 may be any size corresponding to the particular power receiving device 108 requirements, size and configuration of the movable apparatus 102, and desired operational parameters of the specific application. For example, the size of the solar panel 104 may be dependent on whether the generated electricity is to be directly used to power the power receiving device 108, to store power in one or more power storage device (i.e., capacitor), or to charge a battery (not shown) that is used as the primary power source of the power receiving device 108.

According to various embodiments, the solar panel 104 is configured such that the solar cells 106 are mounted to a flexible backing that would allow the solar panel 104 to be bent, folded, curved, or otherwise wrapped around the movable apparatus 102. Further, as will be described in further detail below with respect to FIG. 3, the solar panel 104 may include grommets or other means for detachably mounting the solar panel 104 to the movable apparatus 102. As an illustrative example, according to one implementation, the solar panel 104 may be a 21 W, 61 inch by 15 inch solar panel 104 manufactured by PowerFilm Inc. of Ames, Iowa.

The solar panel 104 is electrically connected to a power receiving device 108 via one or more wires 110. The power receiving device 108 is any device that is to be mounted on the movable apparatus 102 and requires power. For example, as previously described, the power receiving device 108 may be a strain gauge that is to be placed on the propeller shaft of a ship.

According to one embodiment, the power receiving device 108 is electrically connected to a wireless transmitter 112 via one or more wires 110. The wireless transmitter 112 may be used to transmit data collected by the power receiving device 108 to a wireless receiver 114 attached to a fixed power source 118 for storage and/or display. It should be appreciated that there may be more or fewer components to the contactless power generation system 100 than shown, depending on the particular application. For example, the data collected by the power receiving device 108 may be stored internally and not transmitted to a fixed device. Alternatively, the transmitter 112 and receiver 114 may each be transceivers capable of two-way communication to allow for wireless communications between a laptop or other computing device (not shown) and the power receiving device 108 during rotation of the movable apparatus 102. Moreover, the transmitter 112 may be a part of the power receiving device 108 rather than a separate component.

Because the solar panel 104 may be mounted in a location in which natural sunlight is not available, such as in an engine compartment of a ship, embodiments described herein utilize an LED array 120 to provide the light 124 utilized by the solar panel 104 to create electricity. The LED array 120 includes any number of LEDs 122 mounted in any arrangement or configuration. As will be described in further detail below with respect to FIG. 2, the LED array 120 may be mounted to a flexible circuit board that enables the LED array 120 to be bent, folded, curved, or wrapped in a manner similar to that described with respect to the solar panel 104. Doing so allows the LED array 120 to be positioned according to the specific configuration of the solar panel 104, which optimizes the uniformity of the light field and the efficiency of the corresponding power generation by the solar panel 104. Because the LED array 120 is fixed in relation to the movable apparatus 102, the LED array 120 may operate using the fixed power source 118, converting commonly available 120-240 volt alternating current to 9-24 volts for illumination of the LEDs 122 and to provide a safe low-voltage alternative to other potential power sources.

According to one embodiment, one or more lenses 128 may be positioned between the LED array 120 and the solar panel 104. The lens 128 may be used to allow for the beam pattern associated with the light 124 to be manipulated according to the desired light input to the solar panel 104. In this embodiment, the lens 128 may be fixed so that the beam pattern is manipulated by adjusting the flexible LED array 120 behind the lens 128. Alternatively, the lens 128 may be easily adjusted or repositioned so that the beam pattern is manipulated by moving the lens 128 with respect to the LED array 120. It should be appreciated that the precise light output characteristics may be customized according to the particular application by manipulating the type and color of LEDs 122 used in the LED array 120, the power supplied to the LEDs 122, the number of LEDs 122 used, and the arrangement of the LEDs 122 on the flexible circuit board to which they are attached.

As discussed below, according to one implementation, light 124 is output in a color temperature range of between 5000K-7000K, to simulate natural sunlight. However, according to other embodiments, the solar panel 104 and LED array 120 may be configured to provide and utilize light having other color characteristics. For example, the LED array 120 may be configured to provide monochromatic illumination such as red, blue, green, or ultra-violet, while the solar panel 104 is configured to optimize the conversion of this monochromatic illumination to electricity.

Figure 2:
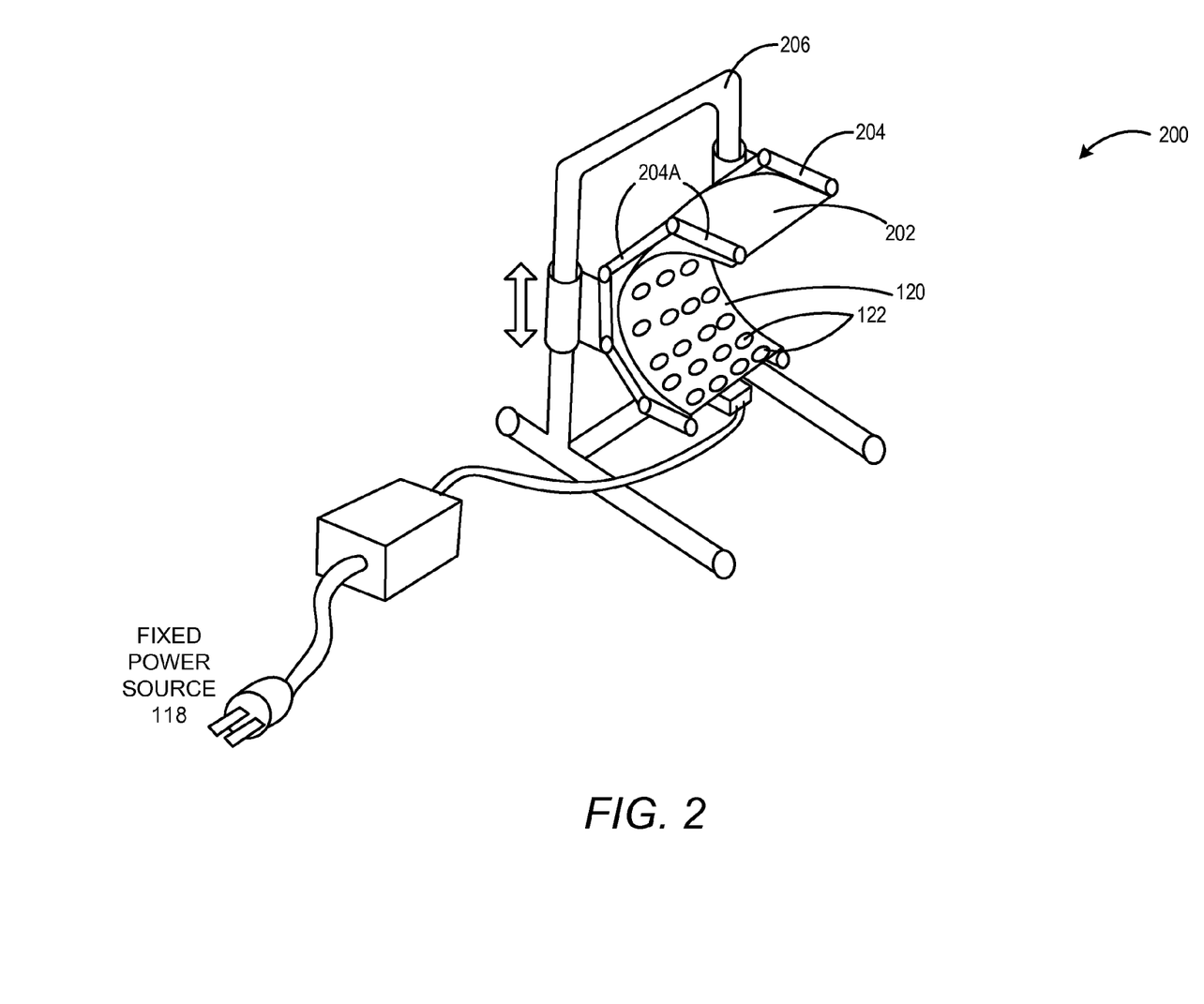
FIG. 2 is a perspective view of a LED fixture according to various embodiments presented herein.

Turning now to FIG. 2, one embodiment of a LED fixture 200 will be described. In the embodiment shown, the LED fixture 200 is to be used in an application in which a power receiving device 108 is mounted on a rotating shaft, such as the described strain gauge mounted on a propeller shaft. In such an application, the LED fixture 200 may be configured to position the LED array 120 mounted on the flexible circuit board 202 as an arc or semi-circle having a radius larger than the radius of the shaft on which the solar panel 104 will be mounted by an amount substantially equivalent to desired gap width.

According to the embodiment shown in FIG. 2, the flexible circuit board 202 containing the LED array 120 is attached to an adjustable framework 204 that is slidably mounted on a base 206. The adjustable framework 204 may include any number of segments 204A that can be rotated with respect to one another in order to manipulate the LED array 120 into the desired shape. Alternatively, the adjustable framework 204 may be made from a malleable material that can be bent into the desired shape. By providing the flexibility to quickly and easily alter the shape and configuration of the LED array 120, the adjustable framework 204 allows the LED fixture 200 to be easily adapted for use with rotating shafts of differing diameters. It should be understood that any known materials or methods may be used to create the adjustable framework 204 to mount the LED array 120 in the desired shape without departing from the scope of this disclosure.

Figure 3:
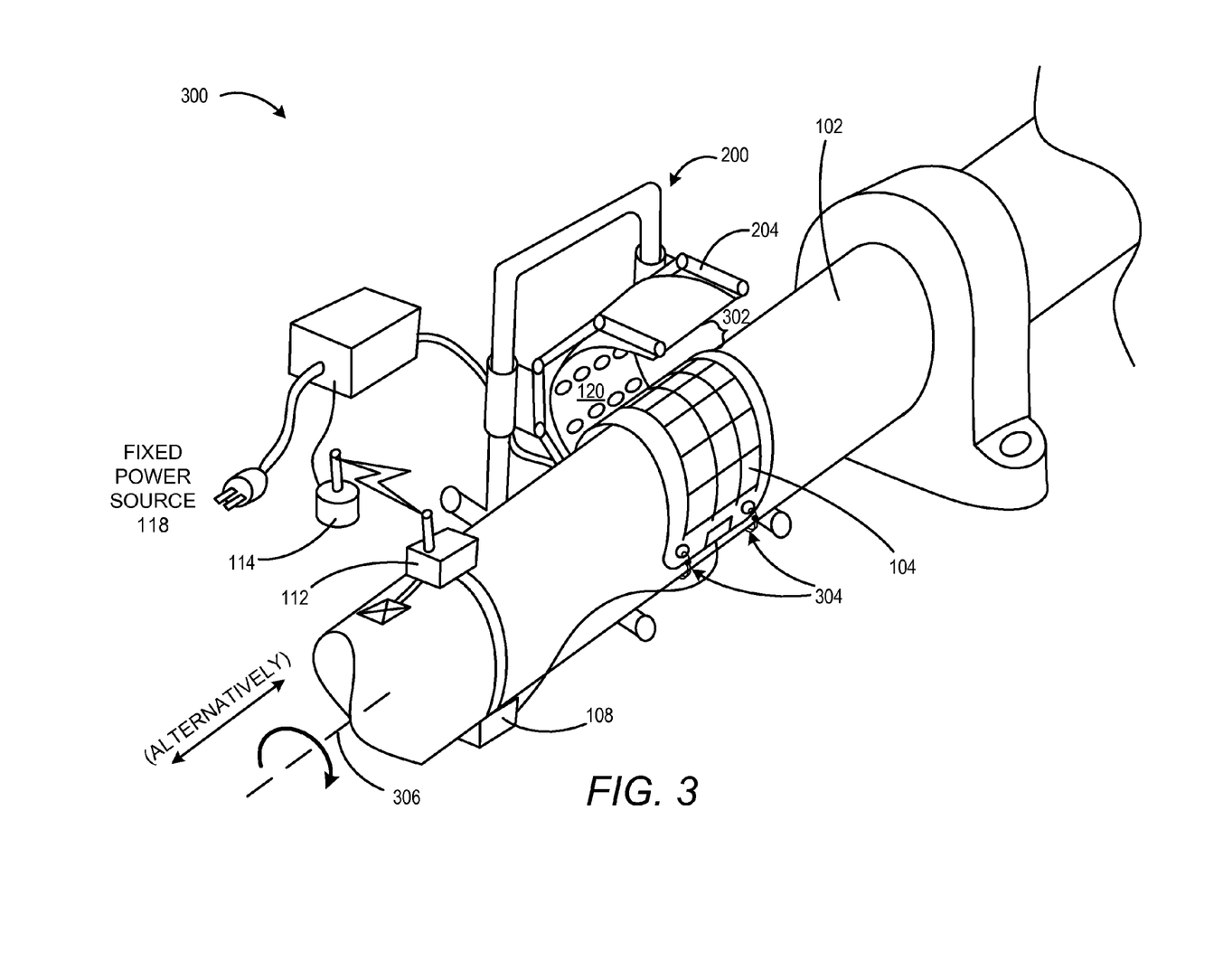
FIG. 3 is a perspective view of a contactless power generation system utilized to provide power to a device attached to a rotating shaft according to various embodiments presented herein.

The adjustable framework 204 may additionally be mounted on a base 206 that provides stability for the LED fixture 200, while allowing the adjustable framework 204 and attached LED array 120 to be raised and lowered to a desired height corresponding to a distance of the rotating shaft from the floor or other surface. The base 206 and the adjustable framework 204 may be manufactured from any material and be adjustable in any known manner, including alteration of the arc radius of the LED array 120 and movement of the adjustable framework around three axes. While the FIGS. 2 and 3 show the LED fixture 200 as having a LED array 120 that curves through a central angle of approximately 180 degrees from a top edge to a bottom edge of the array, it should be understood that the LED array 120 may be any length, creating any central angle, including 360 degrees such that the LED array 120 completely surrounds the solar panel 104 and the rotating shaft it is mounted to.

The light source for providing light 124 to the solar panel 104 has been described herein as being the LED array 120. It should be appreciated that other conventional light sources, such as incandescent and fluorescent bulbs, could be used to provide the light 124. However, LEDs 122 offer distinct advantages over other light sources. First, LEDs 122 may be configured to provide an illumination output in a color temperature range that encompasses natural sunlight, i.e., 5000K-7000K with high efficiency. Traditional incandescent and fluorescent bulbs provide light in this color temperature range at much lower efficiencies, creating inefficiencies for the solar panel 104 in generating electricity. LEDs 122 are significantly more efficient than other light sources, consuming less power for equivalent light output. Additionally, the operating life of a LED 122 is significantly greater than other traditional light sources and the color bandwidth of a LED 122 is relatively stable over the life of the LED, unlike that of incandescent and fluorescent lights.

LEDs 122 also emit lower heat than other light sources, allowing them to be mounted closer to the illuminated surface without damaging the surface. LEDs 122 are durable, vibration resistant, tolerant of wide temperature ranges, and water resistant. These characteristics are ideal for shipboard and industrial applications. As described herein and shown in the figures, LEDs 122 are small, allowing for installation on a flexible circuit board 202 that can then be bent, manipulated, and adjusted to closely match the contour of the illuminated surface to create a uniform light field, evenly distributing the light 124 and increasing efficiency of the contactless power generation system 100.

Looking now at FIG. 3, an illustrative contactless power generation system 300 will be described. In this example, which has been discussed throughout this disclosure, the contactless power generation system 300 is used to transfer power from a shipboard fixed power source 118 to a strain gauge, or power receiving device 108, mounted on a propeller shaft, or movable apparatus 102. In this example, the solar panel 104 is attached to the propeller shaft using bungee cords 304 or other attachment means. It should be understood that any detachable mounting method may be used to attach the solar panel 104 to the propeller shaft, including but not limited to, bungee cords 304, straps, hook and loop fasteners, adhesive, or any combination thereof. By mounting the solar panel 104 such that it is detachable, the contactless power generation system 300 may be quickly installed and removed without requiring extensive downtime of the propeller shaft or other applicable movable apparatus 102.

After the solar panel 104 is installed, the LED fixture 200 described above with respect to FIG. 2 is installed in close proximity to the propeller shaft where the solar panel 104 is attached. The LED fixture 200 may be fixed to the surface below using clamps, fasteners, adhesive, tack welding, or any other suitable securing means. The adjustable framework 204 of LED fixture 200 is adjusted so that a constant gap width 302 is maintained between the LED array 120 and the solar panel 104. The gap width 302 may vary according to the characteristics of the LEDs 122 being used and the solar panel 104. According to one embodiment, the gap width 302 is approximately four to six inches. As discussed above, this relatively large, non-critical gap width 302 provides a benefit over other power generation solutions such as inductive coupling since close tolerances are not necessary. Installation is relatively simple and quick.

The strain gauge (power receiving device 108) is mounted to the propeller shaft and is connected to a wireless transmitter 112 for transferring data from the gauge to a wireless receiver 114 during rotation of the propeller shaft. With the components of the contactless power generation system 300 installed, the LED array 120 is activated and the propeller shaft is engaged, rotating around axis 306. It should be appreciated that in alternative embodiments, the movable apparatus 102 may oscillate linearly back and forth along the axis 306 instead of rotating.

Figure 4:
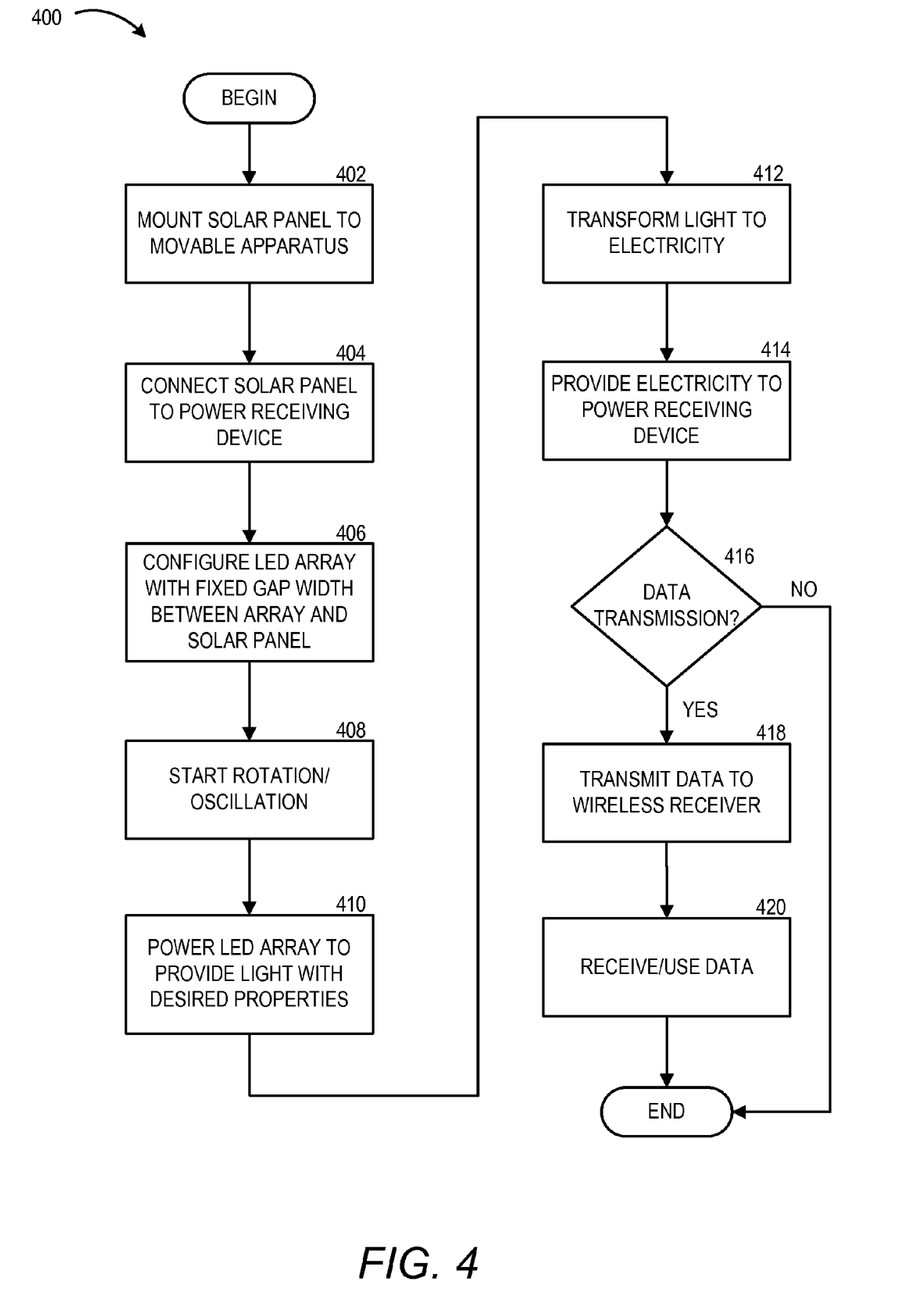
FIG. 4 is a flow diagram showing a method for providing electricity to a power receiving device on a movable apparatus according to various embodiments presented herein.

Turning now to FIG. 4, an illustrative routine 400 for providing electricity to a power receiving device on a movable apparatus will now be described in detail. It should be appreciated that more or fewer operations may be performed than shown in the figures and described herein. These operations may also be performed in a different order than those described herein.

The routine 400 begins at operation 402, where the solar panel 104 is mounted to the movable apparatus 102. As previously noted, the solar panel may be wrapped around any apparatus and affixed with bungee cords, straps, ties, or any other suitable means. From operation 402, the routine 400 continues to operation 404, where the solar panel is electrically connected to the power receiving device 108, as well as to the wireless transmitter 112, either directly or via the power receiving device 108, if data is to be transmitted during operation of the movable apparatus 102. The routine continues from operation 404 to operation 406, where the LED array 120 is configured to create a fixed gap width 302 between the LEDs 122 and the solar cells 106 of the solar panel 104. Doing so may include modifying the adjustable framework 204 to correspond with the characteristics of the outer surface of the movable apparatus 102 to which the solar panel 104 is attached.

From operation 406, the routine 400 continues to operation 408, where the movable apparatus 102 is engaged. For a rotating shaft, this process includes initiating the rotation of the shaft, and for an oscillating apparatus, the process includes the initiation of the oscillating motion. At operation 410, the LED array 120 is powered up using the fixed power source 118. As discussed above, the LEDs 122 are configured to provide light 124 within the color temperature range that best matches the response of the solar panel. According to one implementation, the light 124 is output at approximately 5000K-7000K, corresponding to the color temperature of sunlight.

The routine 400 continues from operation 410 to operation 412, where the light 124 is transformed into electricity within the solar panel 104 and provided to the power receiving device 108 at operation 414. It should be appreciated that the electricity may be stored by the solar panel 104, transferred directly to the power receiving device 108, or transferred into an energy storage medium such as one or more capacitors or rechargeable batteries (not shown) electrically connected to the solar panel 104 and power receiving device 108.

From operation 414, the routine 400 continues to operation 416, where a determination is may as to whether data from the power receiving device 108 is to be transmitted to the wireless receiver 114. This determination may be made according to computer executable instructions stored within the power receiving device 108, or the power receiving device 108 may be configured to directly transfer all data to an external port connected to the wireless transmitter 112 or to an internal wireless transmitter 112 for immediate transmission. If data collected by the power receiving device 108 is to be stored rather than transmitted, then the routine 400 ends. However, if the data is to be transmitted, then the routine 400 continues to operation 418, where it is transmitted to the wireless receiver 114 from the wireless transmitter 112. At operation 420, the data is received at the wireless receiver 114, where it may be stored and/or used by a computing device (not shown) for aggregation, further computation, or display, and the routine 400 ends.

It should be clear from the disclosure above that the embodiments provided herein allow for an electronic device to be quickly and easily installed on a rotating shaft or other moving apparatus at relatively low cost as compared to traditional solutions. The LED fixture 200 described above is easily configurable and reconfigurable according to any shaft diameter or other surface shape of the movable apparatus 102 to which the solar panel 104 is mounted due to the flexible circuit board 202 to which the LEDs 122 are connected, coupled with the versatility of the adjustable framework 204 and base 206 to which the flexible circuit board 202 is mounted.

Because the solar panel 104 is flexible, it may be quickly and easily strapped or otherwise detachable secured to the shaft or other movable apparatus 102 so that it conforms to the shape of the outer surface of the apparatus. The versatility of the LED fixture 200 allows for a uniform gap width 302 to be created between the LEDs 122 and the solar cells 106 to increase efficiency. The low voltage requirements, optimal light output characteristics, heat management characteristics, ruggedness (tolerance of humidity, temperature, and vibration), reliability, and long life associated with LEDs 122 provides a significantly improved light source for the solar panel 104 as compared with conventional lighting options.

The subject matter described above is provided by way of illustration only and should not be construed as limiting. Various modifications and changes may be made to the subject matter described herein without following the example embodiments and applications illustrated and described, and without departing from the true spirit and scope of the present disclosure, which is set forth in the following claims.

What is claimed is:

1. A contactless power generation system, comprising:
 a solar panel comprising a plurality of solar cells, the solar panel configured to mount to a movable apparatus and to receive light from a stationary light source at the plurality of solar cells, to transform the light to electricity, and to provide the electricity to a power receiving device; and
 a light-emitting diode (LED) array comprising a plurality of LEDs, the LED array configured as the stationary light source to provide the light to the solar panel, wherein upon each occurrence of the solar panel passing within proximity of the LED array the plurality of LEDs are substantially evenly spaced apart from the plurality of solar cells to provide a uniform light field to the solar panel recurrently passing within proximity of the LED array, and wherein substantially the same distance is maintained between the LED array and the moveable apparatus as the moveable apparatus moves, and wherein the moveable apparatus comprises a shaft having an axis and the LED array is substantially radially displaced from the shaft and extends along the length of the shaft.

2. The contactless power generation system of claim 1, wherein the solar panel comprises the plurality of solar cells configured on a flexible backing such that the solar panel is configured to wrap around the shaft in a radial manner, and wherein the LED array is substantially radially spaced from the axis of the shaft, thereby defining a uniform radial gap width upon each occurrence of the solar panel rotating within proximity of the LED array.

3. The contactless power generation system of claim 2, wherein the shaft comprises a propeller shaft of a watercraft.

4. The contactless power generation system of claim 1, wherein the LED array is configured to provide the light at a color temperature optimized for use with the solar panel.

5. The contactless power generation system of claim 4, wherein the LED array is configured to provide the light at a color temperature range between 5000K and 7000K.

6. The contactless power generation system of claim 1, wherein the plurality of LEDs are substantially evenly spaced apart from the plurality of solar cells by a gap width that comprises a non-critical tolerance.

7. The contactless power generation system of claim 1, further comprising a lens positioned between the LED array and the solar panel such that a light beam pattern associated with at least one LED may be adjusted with the lens to provide the light with the light beam pattern.

8. The contactless power generation system of claim 1, wherein the LED array comprises the plurality of LEDs mounted on a flexible circuit board such that the LED array may be configured to match a contour associated with a surface of the shaft to which the solar panel is mounted.

9. The contactless power generation system of claim 1, wherein the shaft comprises an oscillating object such that the solar panel oscillates back and forth under the LED array.

10. The contactless power generation system of claim 1, wherein the solar panel comprises a detachable mounting means such that the solar panel may be detachably connected to the shaft.

11. The contactless power generation system of claim 10, wherein the detachable mounting means comprises at least one of straps and grommets, hook and loop fasteners, and adhesive.

12. A method for providing electricity to a power receiving device on a shaft, comprising:
mounting a solar panel comprising a plurality of solar cells to the shaft;
electrically connecting the solar panel to the power receiving device such that the solar panel may provide electricity to the power receiving device as the solar panel and the power receiving device move with the shaft;
initiating motion of the shaft;
while the apparatus is in motion, continuously maintaining a uniform distance between the shaft and an LED array comprising a plurality of LEDs substantially radially spaced from the shaft and extending along the length of the shaft;
upon each occurrence of the solar panel passing in proximity of the LED array, evenly spacing apart the plurality of LEDs from the plurality of solar cells to provide a uniform light field to the solar panel from the LED array;
transforming the light to electricity within the solar panel; and
providing the electricity to the power receiving device.

13. The method of claim 12, wherein the solar panel comprises the plurality of solar cells configured on a flexible backing, and wherein mounting the solar panel to the movable apparatus comprises wrapping the solar panel around an outer surface of the shaft and detachably mounting the solar panel to the outer surface, and wherein the LED array substantially radially spaced from an axis of the shaft defines a uniform radial gap width upon each occurrence of the solar panel rotating within proximity of the LED array.

14. The method of claim 13, wherein the LED array comprises a plurality of LEDs mounted on a flexible circuit board, and wherein positioning the LED array a fixed distance from the solar panel comprises mounting the flexible circuit board on a fixture such that the LED array matches a contour associated with the outer surface of the shaft and is positioned a fixed gap width from the outer surface of the shaft to which the solar panel is mounted.

15. The method of claim 12, wherein providing light from the LED array comprises providing the light at a color temperature optimized for use with the solar panel.

16. The method of claim 12, further comprising:
electrically connecting a wireless data transmitter to the power receiving device;
mounting the wireless data transmitter on the shaft;
providing a fixed wireless data receiver;
after initiating motion of the shaft, transmitting data from the power receiving device via the wireless data transmitter; and
receiving the data from the wireless data transmitter at the fixed wireless data receiver.

17. A contactless power generation system, comprising:
a rotatable shaft configured to rotate about an axis;
a flexible solar panel comprising a plurality of solar cells on a flexible backing, the flexible solar panel detachably mounted to an outer surface of the rotatable shaft and configured to receive light from a stationary light source at the plurality of solar cells, to transform the light to electricity, and to provide the electricity to a power receiving device mounted to the rotatable shaft;
a LED array comprising a plurality of LEDs mounted on a flexible circuit board, the LED array configured as the stationary light source to provide the light to the solar panel and is substantially radially spaced from the shaft and extends along the length of the shaft, wherein upon each occurrence of the solar panel passing within proximity of the LED array, the flexible circuit board of the LED array is shaped and positioned to correspond with the outer surface of the rotatable shaft such that the plurality of LEDs are substantially evenly spaced a gap width apart from the plurality of solar cells, and wherein a uniform distance is continuously maintained between the LED array and the axis of the rotatable shaft as the shaft rotates.

18. The contactless power generation system of claim 17, further comprising a vehicle, wherein the rotatable shaft comprises a drive shaft, and wherein the power receiving device comprises a sensor configured to measure a characteristic of the rotating shaft.

19. The contactless power generation system of claim 17, wherein the gap width has a non-critical tolerance.

20. The contactless power generation system of claim 17, further comprising:
the power receiving device;
a wireless data transmitter mounted to the rotatable shaft, electrically connected to the power receiving device, and configured to received data from the power receiving device and to wirelessly transmit the data; and
a fixed wireless data receiver configured to receive the data transmitted from the wireless data transmitter.

* * * * *